(12) United States Patent
Miyamoto et al.

(10) Patent No.: US 6,670,714 B1
(45) Date of Patent: Dec. 30, 2003

(54) SEMICONDUCTOR INTEGRATED CIRCUIT DEVICE HAVING MULTILEVEL INTERCONNECTION

(75) Inventors: Koji Miyamoto, Yokohama (JP); Kenji Yoshida, Kawasaki (JP); Hisashi Kaneko, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/337,402

(22) Filed: Jan. 7, 2003

(30) Foreign Application Priority Data

Jul. 22, 2002 (JP) .......................... 2002-212908

(51) Int. Cl.[7] .................. H01L 23/48; H01L 23/40; H01L 23/50
(52) U.S. Cl. .................. 257/758; 257/750; 257/761; 257/762; 257/774; 257/775
(58) Field of Search .................. 257/758, 750, 257/761, 762, 774, 775

(56) References Cited

U.S. PATENT DOCUMENTS

| | | | | |
|---|---|---|---|---|
| 5,619,071 A | * | 4/1997 | Myers et al. | 257/753 |
| 5,827,776 A | | 10/1998 | Bandyopadhyay et al. | |
| 2001/0005624 A1 | * | 6/2001 | Aoyagi et al. | |
| 2003/0001280 A1 | * | 1/2003 | Noguchi et al. | 257/774 |
| 2003/0042610 A1 | * | 3/2003 | Kitada et al. | 257/758 |
| 2003/0089428 A1 | * | 5/2003 | Izumitani et al. | 257/758 |

* cited by examiner

*Primary Examiner*—Jasmine Clark
(74) *Attorney, Agent, or Firm*—Oblon, Spivak, McClelland, Maier & Neustadt, P.C.

(57) ABSTRACT

One via contact through which upper and lower interconnections of a multilevel interconnection are connected to each other is provided when the width or volume of the lower interconnection is not larger than a given value. A plurality of via contacts are arranged at regular intervals, each of which is not larger than a given value, in an effective diffusion region of voids included in the lower interconnection, when the width or volume of the lower interconnection exceeds a given value.

12 Claims, 9 Drawing Sheets

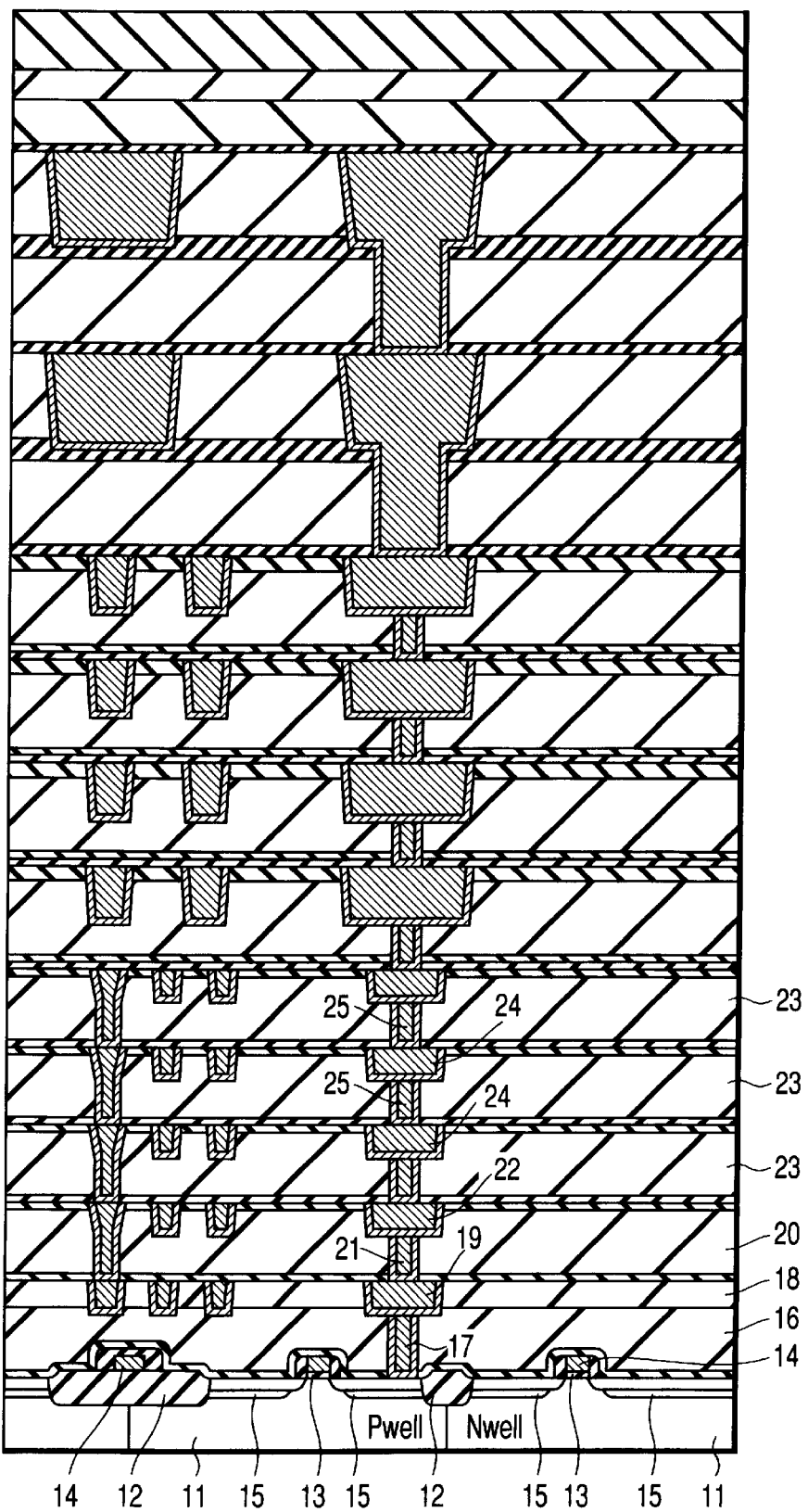
F I G. 4

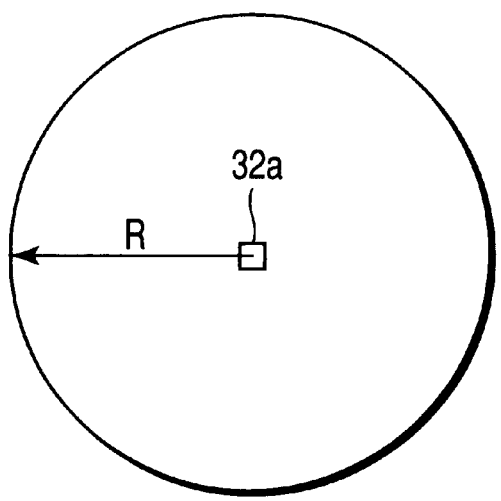
F I G. 10
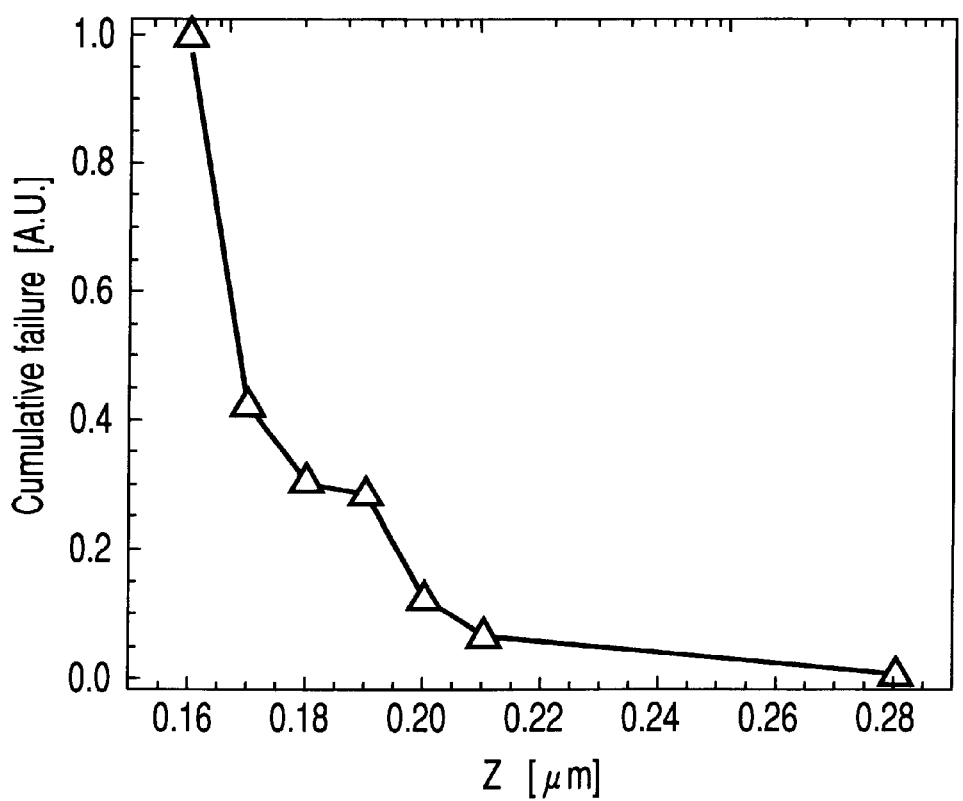
F I G. 11

SEMICONDUCTOR INTEGRATED CIRCUIT DEVICE HAVING MULTILEVEL INTERCONNECTION

CROSS-REFERENCE TO RELATED APPLICATIONS

This application is based upon and claims the benefit of priority from the prior Japanese Patent Application No. 2002-212908, filed Jul. 22, 2002, the entire contents of which are incorporated herein by reference.

BACKGROUND OF THE INVENTION

1. Field of the Invention

The present invention relates to a semiconductor integrated circuit device having a multilevel interconnection structure. More specifically, the invention relates to design rules to form interconnections and via contacts of a multilevel interconnection that is made of copper or materials containing copper as the principal ingredient. The present invention is applied to, for example, a complementary insulated gate semiconductor integrated circuit (CMOS LSI).

2. Description of the Related Art

Instead of conventionally-used aluminum, copper has been used as an interconnection material of LSI having a multilevel interconnection structure in order to decrease the resistance of an interconnection and a via contact and improve the reliability of the LSI.

However, when an interconnection or a via contact made of copper is in a specific shape, it has been turned out that a contact failure occurs due to stress migration caused in the manufacturing process of LSI to decrease the reliability of the LSI.

It has turned out that a contact failure occurs frequently especially in a CMOS LSI so configured that a lower interconnection having a great width is electrically connected to an upper interconnection through a single via contact.

In a semiconductor integrated circuit device so configured that a lower interconnection having a great width is electrically connected to an upper interconnection through a via contact as described above, it is desirable to prevent a contact failure from occurring to improve the reliability of the semiconductor integrated circuit device.

BRIEF SUMMARY OF THE INVENTION

According to one aspect of the present invention, there is provided a semiconductor integrated circuit device comprises a first interconnection which is made of materials containing copper as a principal ingredient and has a given width, length, thickness and volume, a second interconnection which is made of materials containing copper as a principal ingredient and provided above the first interconnection, and at least one via contact which is made of materials containing copper as a principal ingredient and through which the first interconnection and the second interconnection are electrically connected to each other, the at least one via contact including one via contact which is provided when one of the width and the volume of the first interconnection is not larger than a given value and a plurality of via contacts, which are arranged at regular intervals, each of which is not larger than a given value, in a predetermined region of the first interconnection, when one of the width and the volume of the first interconnection exceeds a given value.

BRIEF DESCRIPTION OF THE SEVERAL VIEWS OF THE DRAWING

FIG. 4 is a cross-sectional view of CMOS LSI according to an embodiment of the present invention;

FIG. 10 is a plan view for explaining a void effective diffusion region in a copper interconnection;

FIG. 11 is a graph showing an example of the dependence of a failure rate on a via contact diameter in the CMOS LSI shown in FIG. 6 or 8 in which one via contact is connected to the lower interconnection.

DETAILED DESCRIPTION OF THE INVENTION

Figure 1:
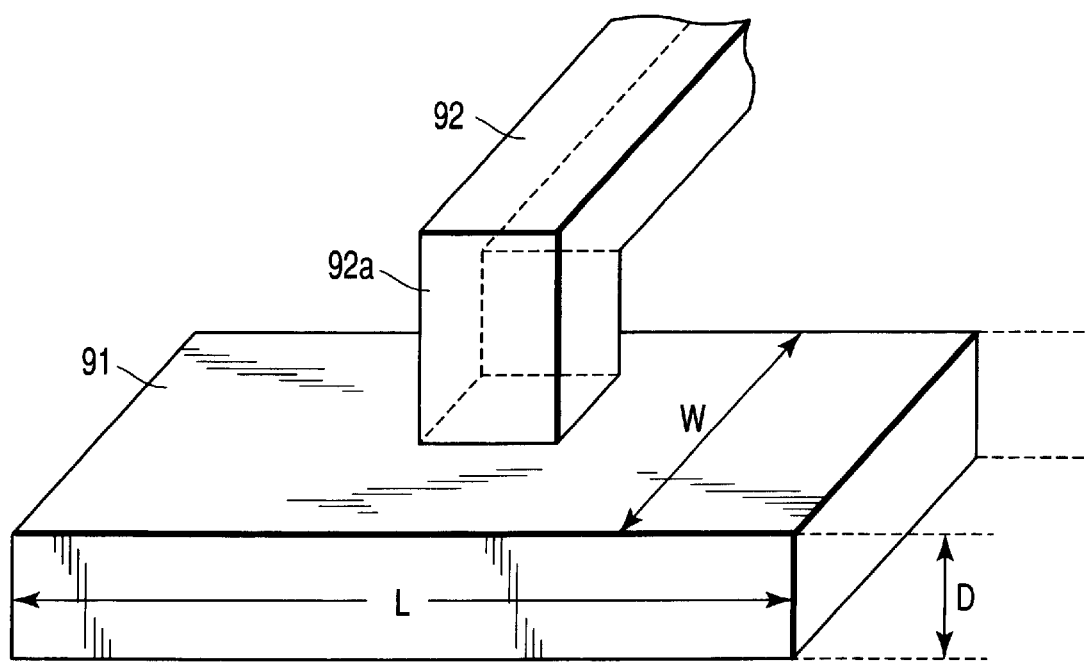
FIG. 1 is a perspective view showing an example of CMOS LSI.

An embodiment of the present invention will now be described with reference to the accompanying drawings. The same components shown throughout the drawings are denoted by the same reference numerals and their descriptions are not repeated for brevity.

FIG. 1 shows an example of the shape of an interconnection and a via contact both of which are made of copper or materials containing copper as the principal ingredient in LSI having a multilevel interconnection structure.

A lower interconnection 91, which is made of copper or materials containing copper as the principal ingredient, has a width W, a length L, and a thickness D. An upper interconnection 92, which is also made of copper or materials containing copper as the principal ingredient, is provided above the lower interconnection 91. The upper and lower interconnections 92 and 91 are electrically connected to each other through a via contact 92a that is made of copper or materials containing copper as the principal ingredient.

In the above LSI so configured that the upper interconnection 92 is electrically connected to the lower interconnection 91, the width W of which is relatively great and not less than a certain value, through the via contact 92*a*, it has turned out that a contact failure occurs due to stress migration when the LSI is subjected to a high-temperature test.

Figure 2:
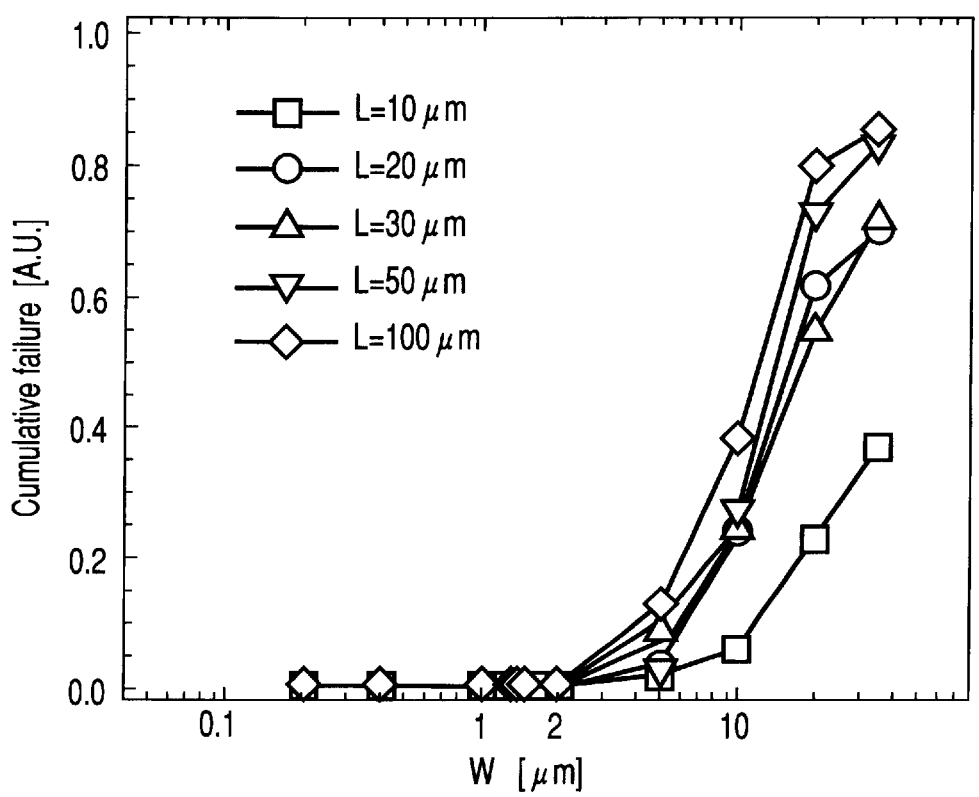
FIG. 2 is a graph showing an example of the dependence of a failure rate on an interconnection width in the CMOS LSI shown in FIG. 1.

FIG. 2 shows an example of the dependence of a failure rate on an interconnection width. The failure rate is obtained by conducting a stress migration test at 225° C. for 300 hours on a CMOS LSI having a multilevel interconnection including a lower interconnection, an upper interconnection, and a via contact as shown in FIG. 1. In FIG. 2, the vertical axis indicates a cumulative failure (A.U.) and the horizontal axis indicates the width W($\mu$m) of the lower interconnection.

The example shown in FIG. 2 was obtained as follows. Four hundred (400) lower interconnections 91 each of which was connected to one via contact 92*a*, as depicted in FIG. 1, were prepared. An interconnection chain formed by connecting these interconnections 91 through via contacts 92*a* was defined as a sample. The lengths L (10 $\mu$m, 20 $\mu$m, 30 $\mu$m, 50 $\mu$m, 100 $\mu$m) were used as parameters. The failure rate was measured for each of the lengths L when the width W was varied.

According to the results of the measurement, when the length L is 10 $\mu$m or greater, a failure starts to occur when the width W exceeds 2 $\mu$m and the failure rate increases when the width W becomes greater.

Figure 3:
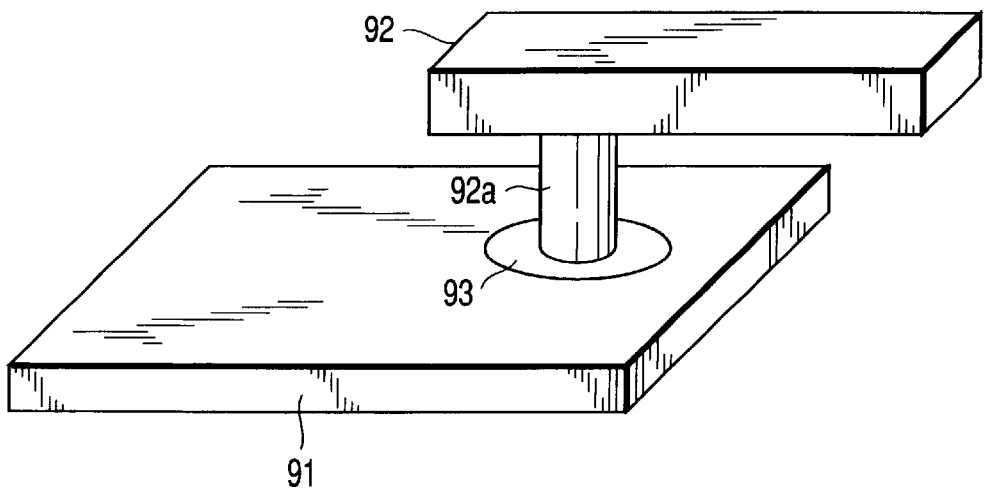
FIG. 3 is a perspective view showing a failure model of the CMOS LSI shown in FIG. 1.

FIG. 3 illustrates a failure model of a contact failure of the via contact 92*a* connected to the lower interconnection 91 as shown in FIG. 1. The lower and upper interconnections 91 and 92 and via contact 92*a* are each formed of copper or materials containing copper as the principal ingredient.

The mechanism to cause the above contact failure can be considered as follows. An interlayer insulation film, which is made of, e.g., $SiO_2$ and PSG (phosphorussilicate glass), is formed between the lower and upper interconnections 91 and 92. A via contact hole is formed in the interlayer insulation film using, e.g., reactive ion etching (RIE). Then, the lower interconnection 91 corresponding to the bottom of the via contact hole is damaged or subjected to stress due to the etching for forming the via contact hole, heat treatment after the via contact hole is formed, and the like. Consequently, when the grain of copper of the lower interconnection 91 is grown by annealing after the via contact hole is formed, voids in the lower interconnection 91 are centralized in a region 93. The region 93 is formed under the via contact hole which is damaged, subjected to stress, or the like or on the bottom of the via contact. The voids centralized in the region 93 cause a contact failure.

When an interconnection or a via contact made of copper or materials containing copper as the principal ingredient is in a specific shape or when a lower interconnection having a great width is electrically connected to an upper interconnection through one via contact, a contact failure occurs due to high-temperature treatment in the manufacturing process to decrease the reliability of the LSI.

In the CMOS LSI so configured that a lower interconnection having a great width is electrically connected to an upper interconnection through a via contact, it is necessary to prevent a contact failure from occurring and improve the reliability of the LSI.

The inventors of the present invention studied and found the following. In a semiconductor integrated circuit device including a semiconductor substrate and a multilevel interconnection formed thereon and having upper and lower interconnections and a via contact made of copper or materials containing copper as the principal ingredient, a contact failure of the via contact, which connects the upper and lower interconnections, depends upon the shape of the interconnections and via contact and the like, as described below.

(1) The contact failure depends upon the width and thickness of the lower interconnection.

(2) When another wide interconnection is formed in contact with one end of the lower interconnection such that they are flush with each other, the contact failure depends upon the width and thickness of the former wide interconnection.

(3) The contact failure depends upon the diameter of the via contact.

(4) The contact failure depends upon a heat treatment step of forming the lower interconnection and the via contact.

In the semiconductor integrated circuit device according to the present invention, the following design rules are adopted in order to avoid the contact failure.

(1) The number of via contacts for the lower interconnection is varied with the width or thickness of the lower interconnection.

(2) When a plurality of via contacts are brought into contact with the lower interconnection, they are arranged such that an interval between adjacent contacts within a predetermined area is not longer than a given value.

(3) When an interconnection is formed in contact with one end of the lower interconnection such that they are flush with each other, the number of via contacts for the lower interconnection is varied with the width or thickness of the former interconnection.

(4) The diameter of the via contact provided between the upper and lower interconnections is set in accordance with the width of the lower interconnection.

FIG. 4 is a schematic cross-sectional view of the CMOS LSI according to an embodiment of the present invention. The CMOS LSI is, for example, a silicon-on-insulator (SOI) type LSI and has a multilevel interconnection structure that is made of copper or materials containing copper as the principal ingredient. FIG. 4 shows an interconnection structure of eleven layers as an example of a multilevel interconnection structure; however, the present invention is not limited to this interconnection structure.

A semiconductor region 11 is formed on an insulation film (not shown) and includes a plurality of P-type wells and N-type wells. The semiconductor region 11 is divided into a plurality of element regions by an element isolation region 12 of STI (shallow trench isolation). A gate oxide film 13 and a gate electrode 14 of a MOS transistor are stacked on each of the element regions, and source and drain regions 15 of the MOS transistor are formed in the surface region of each of the element regions. Further, a first interlayer film 16 made of an insulation film is formed on the entire surface of the resultant structure. A contact hole communicating with at least one of the source and drain regions 15 is formed in the first interlayer film 16, and a contact plug 17 is formed in the contact hole. A second interlayer film 18 made of an insulation film is formed on the contact plug 17.

An interconnection trench is formed in the second interlayer film 18 and a first metal interconnection 19 is formed in the interconnection trench. The first metal interconnection 19 is electrically connected to the contact plug 17. A third interlayer film 20 made of an insulation film is formed on the first metal interconnection 19.

A via contact 21 and a second metal interconnection 22 are formed in the third interlayer film 20. The via contact 21 is electrically connected to the first and second metal interconnections 19 and 22.

In FIG. 4, an interlayer film (insulation film) that is formed higher than the third interlayer film 20 is indicated by reference numeral 23, a metal interconnection that is formed higher than the second metal interconnection 22 is indicated by reference numeral 24, and a via contact connecting the metal interconnection 24 and its upper metal interconnection 24 is indicated by reference numeral 25.

The steps of manufacturing the CMOS LSI shown in FIG. 4 will now be described with reference to FIGS. 5A to 5D.

Figure 5A:
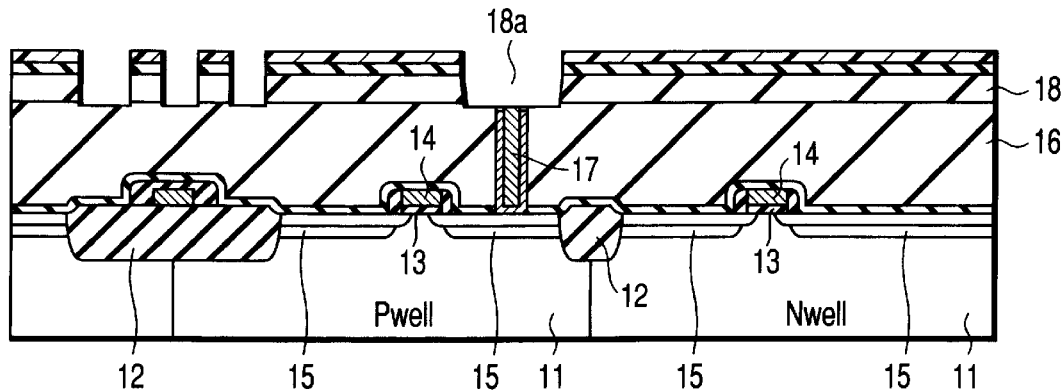
FIGS. 5A to 5D are cross-sectional views sequentially showing steps of manufacturing the CMOS LSI shown in FIG. 4.

Referring to FIG. 5A, an element isolation region 12 and a gate oxide film 13, a gate electrode 14 and source and drain regions 15 of a MOS transistor are formed. After that, a CVD oxide film ($SiO_2$) containing phosphorus or boron is deposited as a first interlayer film 16, and the first interlayer film 16 is flattened by CMP. Then, a contact hole is opened in the first interlayer film 16 and a contact plug 17 is buried into the contact hole. After that, a second interlayer film 18 is deposited and a trench 18a is formed in the second interlayer film 18.

Figure 5B:
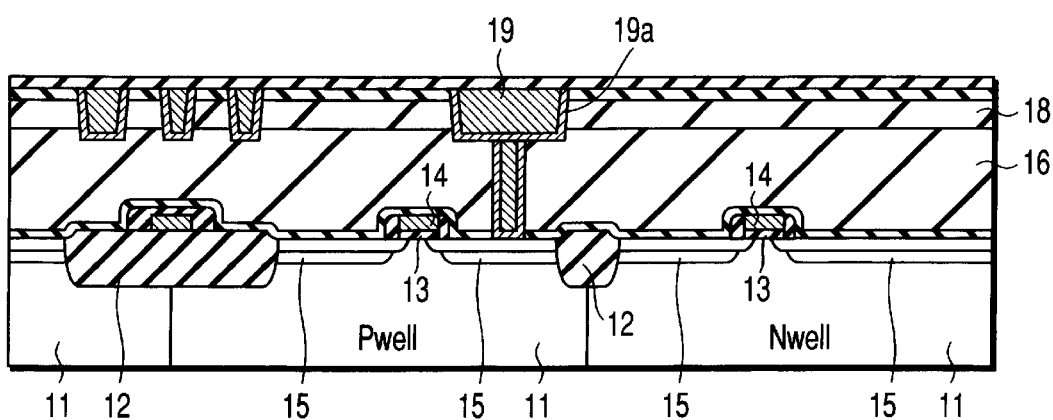

Referring to FIG. 5B, copper is buried into the trench 18a with barrier metal 19a interposed therebetween, and the resultant structure is flattened by CMP to form a first metal interconnection 19. In this case, the trench 18a is processed such that part of the first metal interconnection 19 is connected to the top of the contact plug 17.

Figure 5C:
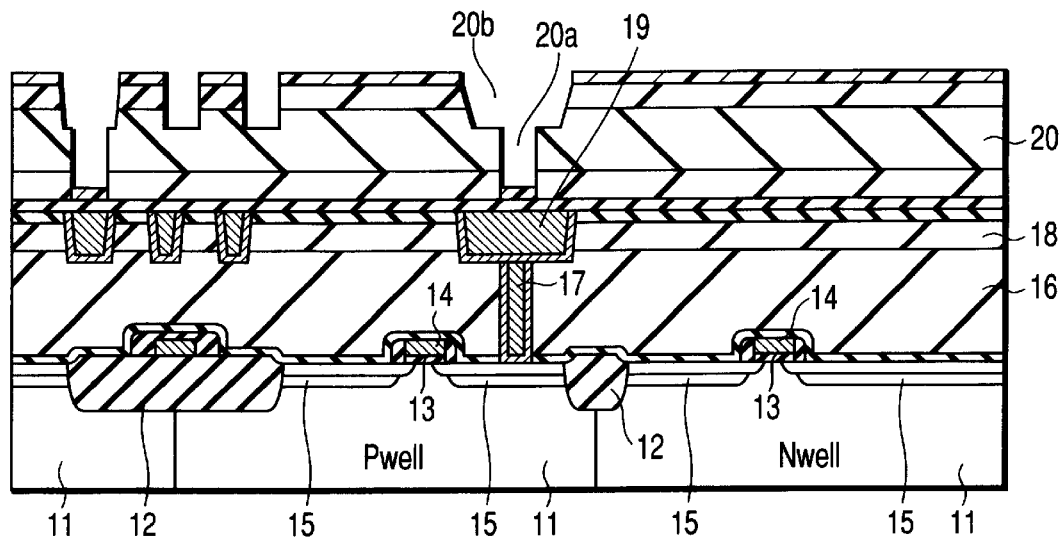

Referring to FIG. 5C, a third interlayer film 20 is deposited, and a via contact hole 20a and a trench 20b are formed in the third interlayer film 20 by, for example, reactive ion etching (RIE).

Figure 5D:
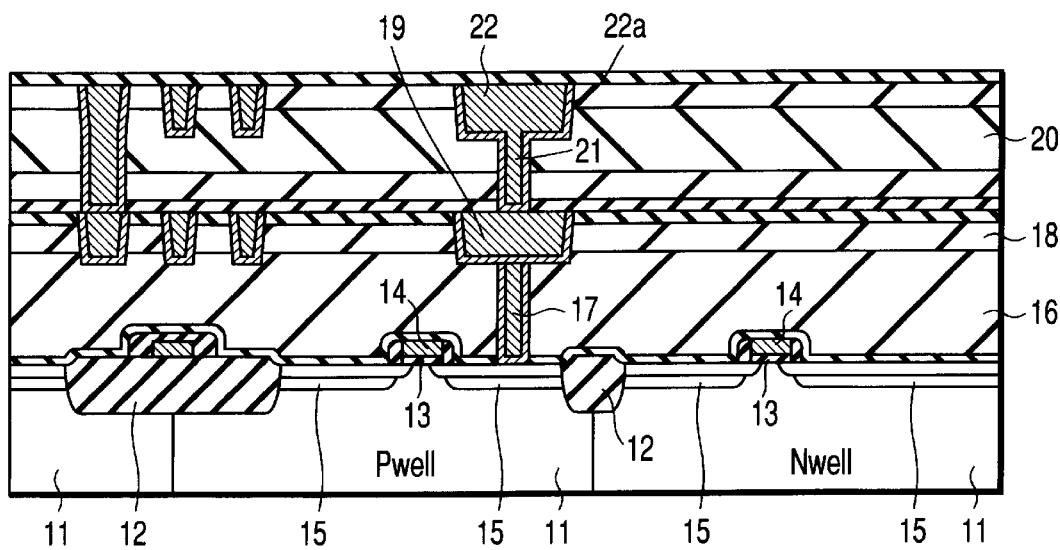

Referring to FIG. 5D, copper is buried into the via contact hole 20a and trench 20b with barrier metal 22a interposed therebetween and then the resultant structure is flattened by CMP to form a via contact 21 and a second metal interconnection 22. In this case, the via contact hole 20a and trench 20b are processed such that part of the second metal interconnection 22 communicates with the top of the via contact 21.

After that, the same steps as those shown in FIGS. 5C and 5D are repeated, thereby forming metal interconnections and via contacts higher than the second metal interconnection 22.

FIGS. 6 to 9 illustrate examples of various shapes of a via contact through which a lower interconnection 31 is electrically connected to an upper interconnection 32 formed thereon in the multilevel interconnection of the CMOS LSI shown in FIG. 4.

In FIGS. 6 to 9, the dimensions of the lower interconnection 31 are represented by width W, length L and thickness D. The volume S of the lower interconnection 31 is therefore given by the following equation: S=W×L×D.

Figure 6:
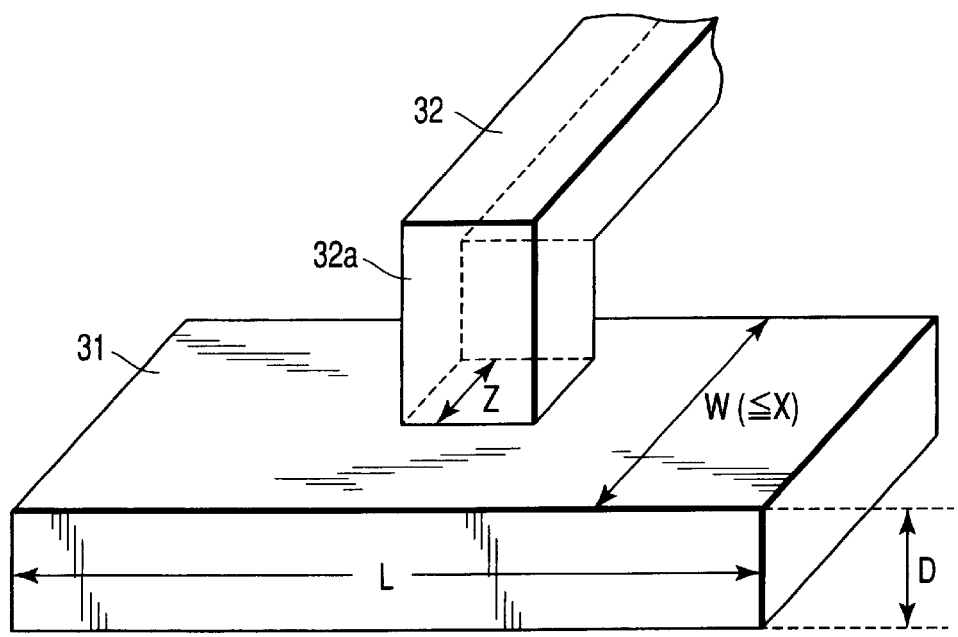
FIG. 6 is a perspective view showing an example of the shape of a via contact through which upper and lower interconnections of a multilevel interconnection in the CMOS LSI shown in FIG. 4.

As shown in FIG. 6, one via contact 32a is formed in the lower interconnection 31 whose width W is small and not greater than a given value X (W≦X) and whose volume S is not greater than a given value, in order to connect the lower interconnection 31 to the upper interconnection 32.

The given value X of the width W depends upon the thickness D. As the thickness D increases, the value X needs to decrease or the interconnection needs to be thinned. As the diameter Z of the via contact 32a increases, the value X can increase or the interconnection can be thickened. For example, when L=20 µm and D=0.25 µm, it turns out from the measurement results, which will be described later with reference to FIG. 11, that the given value X is 2 µm or less.

Figure 7:
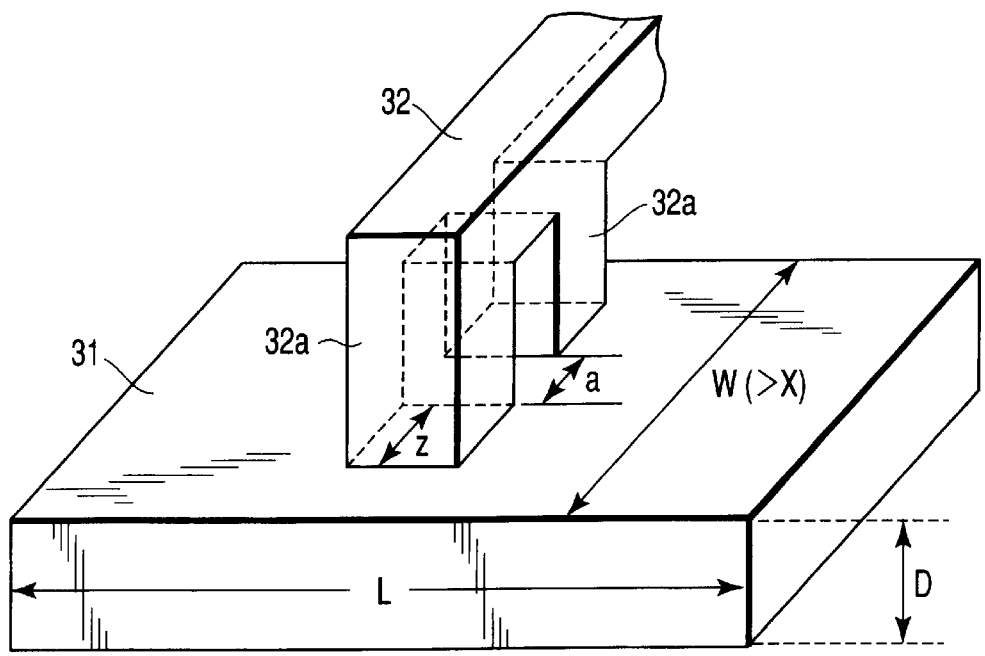
FIG. 7 is a perspective view showing another example of the shape of a via contact through which upper and lower interconnections of a multilevel interconnection in the CMOS LSI shown in FIG. 4.

In contrast, as shown in FIG. 7, a plurality of via contacts 32a (two in the example shown in FIG. 7) are arranged at regular intervals, each of which is not larger than a given value a, in a predetermined region of the lower interconnection 31 whose width W exceeds a given value X (W>X) or whose volume S exceeds a given value, in order to connect the lower interconnection 31 to the upper interconnection 32.

The above predetermined region corresponds to a void effective diffusion region. The void effective diffusion region is a region in which voids in the Cu interconnection (lower interconnection) are centralized by diffusion in the vicinity of the bottom of a via contact which is damaged or subjected to stress due to etching for forming, e.g., a via contact hole 20a shown in FIG. 5C, heat treatment after the hole is opened, or the like. If a via contact is formed in the void effective diffusion region, a contact failure will occur. The void effective diffusion region is defined by an almost circular region at a radius of R from the center of the bottom of one (redundancy via contact) of a plurality of via contacts in which the largest number of voids are centralized.

FIG. 10 is a plan view for explaining the void effective diffusion region in the Cu interconnection. The radius R from the center of the bottom of the via contact 32a can be defined by both diffusion coefficient F and diffusion time t of voids included in the Cu interconnection formed under the via contact 32a. In other words, the radius R is given by the following equation: $R=(F \cdot t)^{0.5}$. Since the diffusion coefficient F depends upon the Cu process and the diffusion time t varies, the radius R of the void effective diffusion region cannot necessarily be determined; however, for example, it is typically 25 µm.

If a plurality of via contacts 32a (two in the example shown in FIG. 7) are formed, the voids included in the lower interconnection 31 are unevenly distributed and centralized under the bottom of one via contact and that of another via contact at the time of heat treatment. It therefore turns out that the via contact in which the largest number of voids are centralized serves as a redundancy via contact to prevent the characteristics of the remaining via contacts from deteriorating and prevent the reliability of the CMOS LSI from decreasing.

Figure 8:
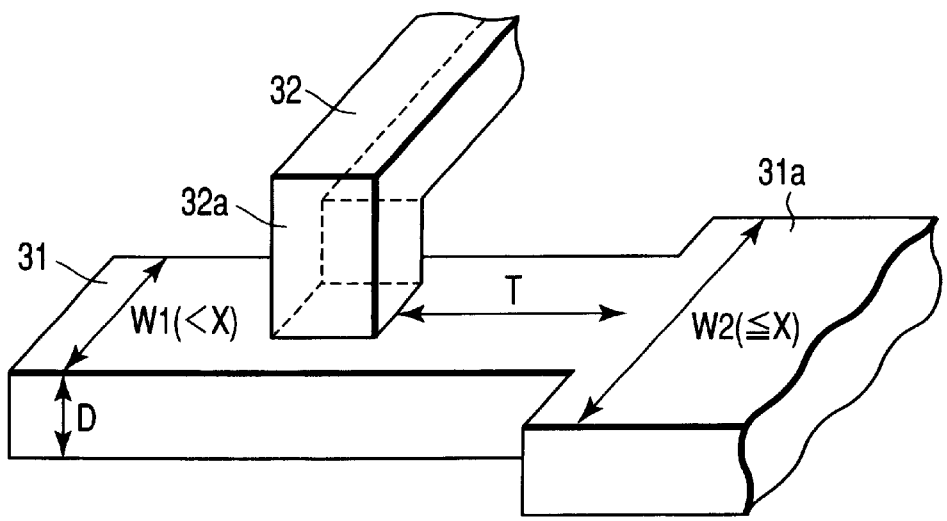
FIG. 8 is a perspective view showing still another example of the shape of a via contact through which upper and lower interconnections of a multilevel interconnection in the CMOS LSI shown in FIG. 4.

In the example shown in FIG. 8, an interconnection 31a is formed in contact with one end of the lower interconnection 31 whose width W1 is less than a given value X (e.g., 2 µm) or whose volume S1 is less than a given value. The interconnections 31 and 31a are flush with each other. If the width W2 of the interconnection 31a is not greater than the given value X or the volume S2 thereof is not greater than the given value, one via contact 32a is formed as a via contact to be connected to the lower interconnection 31, as shown in FIG. 8.

Figure 9:
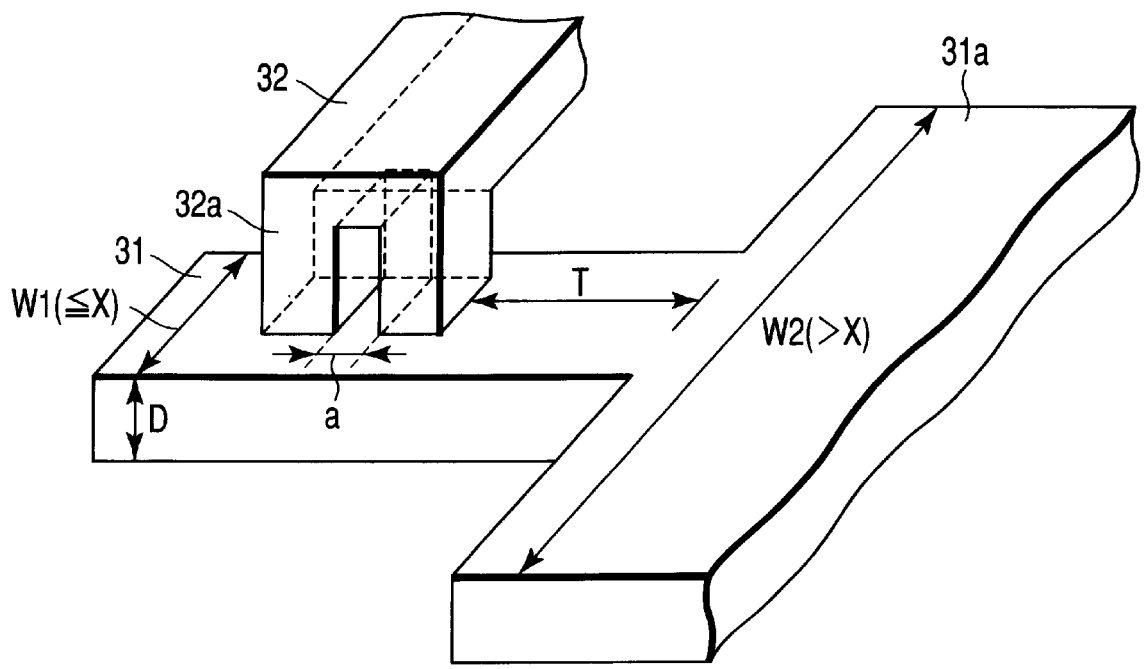
FIG. 9 is a perspective view showing yet another example of the shape of a via contact through which upper and lower interconnections of a multilevel interconnection in the CMOS LSI shown in FIG. 4.

In the example shown in FIG. 9, an interconnection 31a is formed in contact with one end of the lower interconnection 31 whose width W1 is not greater than a given value X (e.g., 2 µm) or whose volume S1 is not greater than a given value. The interconnections 31 and 31a are flush with each other. If the width W2 of the interconnection 31a exceeds the given value X or the volume S2 thereof exceeds the given value, a plurality of via contacts 32a (two in this example) are arranged at regular intervals, each of which is not smaller than a given value, in a predetermined region or a circular void effective diffusion region having a radius of R as via contacts to be connected to the lower interconnection 31, as shown in FIG. 9.

In the structures shown in FIGS. 8 and 9, when distance T from the contact position of the via contact 32a formed in the lower interconnection 31 to the interconnection 31a formed flush with the lower interconnection 31 is short, the voids in the interconnection 31a are centralized quickly in the contact position of the via contact 32a at the time of heat treatment of the Cu interconnection. In contrast, when the distance T is long, the voids are centralized slowly in the via contact 32a at the time of heat treatment of the Cu interconnection. When the distance T is fixed, the voids are centralized in the contact position of the via contact earlier as the temperature of heat treatment of the interconnection becomes high.

FIG. 11 shows an example of the dependence of a failure rate on the diameter of a via contact (via diameter), which is obtained by conducting a stress migration test, for example, at 225° C. for 300 hours on the CMOS LSI having a multilevel interconnection including a lower interconnection to which one via contact is connected, as shown in FIG. 6 or 8. In FIG. 11, the vertical axis indicates a cumulative failure (A.U.) and the horizontal axis indicates a via diameter $Z(\mu m)$.

The characteristics shown in FIG. 11 are obtained by preparing four hundred (400) lower interconnections 31 each of which has dimensions of 20 $\mu$m long by 0.25 $\mu$m thick by 2 $\mu$m or more wide and is connected to one via contact, forming an interconnection chain by connecting these interconnections through the via contacts, defining the interconnection chain as a sample, and measuring a failure rate when the via contacts are varied in diameter Z.

Consequently, it is understood that if the via diameter Z falls within a range from 0.2 $\mu$m to 0.3 $\mu$m, a contact failure can sufficiently be prevented from occurring.

Figure 12:
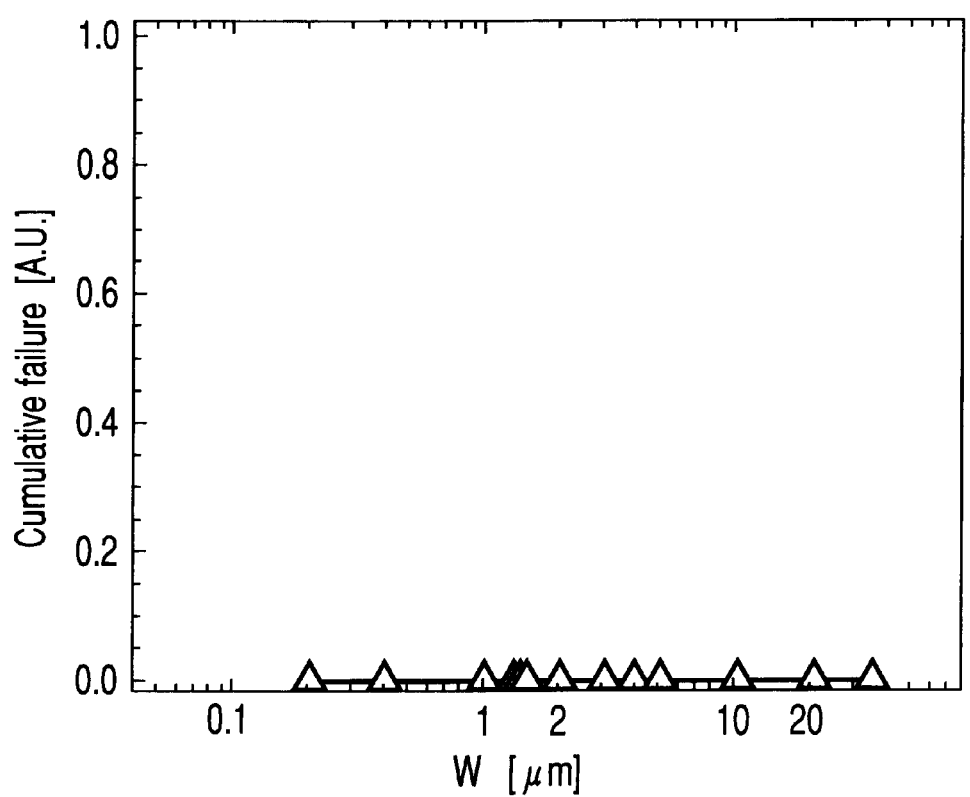
FIG. 12 is a graph showing an example of the dependence of a failure rate on an interconnection width in the CMOS LSI shown in FIG. 7 or 9 in which two via contacts are connected to the lower interconnection.

FIG. 12 shows an example of the dependence of a failure rate on an interconnection width, which is obtained by conducting a stress migration test, for example, at 225° C. for 300 hours on the CMOS LSI having a multilevel interconnection including a lower interconnection 31 to which two via contacts are connected, as shown in FIG. 7 or 9. In FIG. 12, the vertical axis indicates a cumulative failure (A.U.) and the horizontal axis indicates the width $W(\mu m)$ of the lower interconnection.

The characteristics shown in FIG. 12 are obtained by preparing four hundred (400) lower interconnections 31 each of which has a thickness of 0.25 $\mu$m and is connected to two via contacts each having a diameter of 0.2 $\mu$m, forming an interconnection chain by connecting these interconnections through the via contacts, defining the interconnection chain as a sample, using the lengths L of the lower interconnections 31 as parameters (10 $\mu$m, 20 $\mu$m, 30 $\mu$m, 50 $\mu$m, 100 $\mu$m), and measuring a failure rate when the width W is varied with the respective lengths L.

According to the results of the measurement, it is understood that no contact failure occurs in a wide range of the width W from 2 $\mu$m to about 20 $\mu$m and thus the dependence of the failure rate on the width of the interconnection is improved more greatly than that shown in FIG. 2.

The present invention is not limited to the above embodiment. For example, in FIGS. 7 and 9, two via contacts are formed in order to connect upper and lower interconnections to each other. However, three or more via contacts can be formed. The materials of an interlayer film formed between the upper and lower interconnections are not limited to $SiO_2$. PSG (phosphorussilicate glass), other materials, or a laminated film of these materials can be used for the interlayer film.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit device comprising:
   a first interconnection which is made of materials containing copper as a principal ingredient and has a given width, length, thickness and volume;
   a second interconnection which is made of materials containing copper as a principal ingredient and provided above said first interconnection; and
   at least one via contact which is made of materials containing copper as a principal ingredient and through which said first interconnection and said second interconnection are electrically connected to each other, said at least one via contact including one via contact which is provided when one of the width and the volume of said first interconnection is not larger than a given value and a plurality of via contacts, which are arranged at regular intervals, each of which is not larger than a given value, in a predetermined region of said first interconnection, when one of the width and the volume of said first interconnection exceeds a given value.

2. The semiconductor integrated circuit device according to claim 1, wherein voids are unevenly centralized in a contact position of said first interconnection to which said at least one via contact is connected.

3. The semiconductor integrated circuit device according to claim 1, wherein said one via contact is provided when the width and the length of said first interconnection are each 2 $\mu$m or less, and has a diameter of 0.2 $\mu$m or smaller.

4. The semiconductor integrated circuit device according to claim 1, wherein said plurality of via contacts are provided when the width and the length of said first interconnection each exceed 2 $\mu$m, and each have a diameter of 0.2 $\mu$m or smaller.

5. The semiconductor integrated circuit device according to claim 1, further comprising a third interconnection which is made of materials containing copper as a principal ingredient and formed in contact with one end of said first interconnection in a direction of the length of said first interconnection such that the third interconnection is flush with the first interconnection, the third interconnection having a given width, length, thickness and volume,
   wherein said one via contact is provided when one of the width and the volume of said third interconnection is not larger than a given value.

6. The semiconductor integrated circuit device according to claim 5, wherein the width and the length of said third interconnection are each 2 $\mu$m or less and said one via contact has a diameter that is not larger than 0.2 $\mu$m.

7. The semiconductor integrated circuit device according to claim 1, further comprising a third interconnection which is made of materials containing copper as a principal ingredient and formed in contact with one end of said first interconnection in a direction of the length of said first interconnection such that the third interconnection is flush with the first interconnection, the third interconnection having a given width, length, thickness and volume,
   wherein said plurality of via contacts are arranged at regular intervals, each of which is not smaller than a given value, in a predetermined region of said first interconnection when one of the width and the volume of said third interconnection exceeds a given value.

8. The semiconductor integrated circuit device according to claim 7, wherein the width and the length of said third interconnection each exceed 2 μm and said plurality of via contacts each have a diameter that is not larger than 0.2 μm.

9. The semiconductor integrated circuit device according to claim 1, wherein the predetermined region of said first interconnection is a void effective diffusion region in which voids included in said first interconnection are centralized by diffusion on a bottom of said via contact to cause a contact failure in said via contact.

10. The semiconductor integrated circuit device according to claim 9, wherein said void effective diffusion region is defined by an almost circular region at a radius of R from a center of the bottom of one of said plurality of via contacts in which the largest number of voids are centralized.

11. The semiconductor integrated circuit device according to claim 10, wherein the radius R is given by $R=(F \cdot t)^{0.5}$ where F is a diffusion coefficient and t is diffusion time.

12. The semiconductor integrated circuit device according to claim 10, wherein the radius R is 25 μm.

* * * * *